(12) United States Patent
Yang et al.

(10) Patent No.: US 8,916,877 B2
(45) Date of Patent: Dec. 23, 2014

(54) THIN FILM TRANSISTOR, FABRICATION METHOD THEREOF, AND ORGANIC LIGHT EMITTING DIODE DISPLAY HAVING THE SAME

(75) Inventors: Yong-Ho Yang, Yongin (KR); Seung-Gyu Tae, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 59 days.

(21) Appl. No.: 13/591,913

(22) Filed: Aug. 22, 2012

(65) Prior Publication Data

US 2013/0126873 A1 May 23, 2013

(30) Foreign Application Priority Data

Nov. 18, 2011 (KR) .................. 10-2011-0120917

(51) Int. Cl.
*H01L 29/786* (2006.01)
*H01L 27/32* (2006.01)

(52) U.S. Cl.
CPC ....... *H01L 29/78648* (2013.01); *H01L 27/3262* (2013.01)
USPC .............. 257/59; 257/57; 257/66; 257/72; 257/40; 257/88; 257/79; 257/443; 257/431; 257/451

(58) Field of Classification Search
CPC ........................... H01L 27/3258; H01L 33/00
USPC ............ 257/79, 59, 88, 57, 66, 72, 40, 443, 257/431, 451
See application file for complete search history.

(56) References Cited

U.S. PATENT DOCUMENTS

| 2004/0257487 A1* | 12/2004 | Lee et al. ................. 349/43 |
| 2005/0112813 A1* | 5/2005 | Kim et al. ................ 438/197 |
| 2007/0187677 A1* | 8/2007 | Park et al. ................ 257/40 |

FOREIGN PATENT DOCUMENTS

| JP | 2000-194014 | 7/2000 |
| KR | 10-0172256 | 10/1998 |
| KR | 10-2006-0118063 | 11/2006 |

OTHER PUBLICATIONS

J. H. Oh et al. A Center-Offset Polycrystalline-Silicon Thin-Film Transistor With n+ Amorphous-Silicon Contacts. IEEE Electron Device Letters: Jan. 2009; vol. 30, No. 1.

* cited by examiner

*Primary Examiner* — Chuong A Luu
(74) *Attorney, Agent, or Firm* — Robert E. Bushnell, Esq.

(57) ABSTRACT

A thin film transistor (TFT) comprises: an active layer formed on a substrate; a gate insulating layer formed on the active layer; a gate electrode including a first gate region and a second gate region formed on portions of the gate insulating layer and spaced apart with a separation region interposed therebetween; an interlayer insulating layer formed on the gate insulating layer and the gate electrode, and having an opening formed to expose portions of the gate insulating layer and the gate electrode around the separation region; a gate connection electrode formed on the interlayer insulating layer and connected to the first gate region and the second gate region through the opening; and source and drain electrodes formed on the interlayer insulating layer. The TFT and the OLED display device have excellent driving margin without a spatial loss.

8 Claims, 8 Drawing Sheets

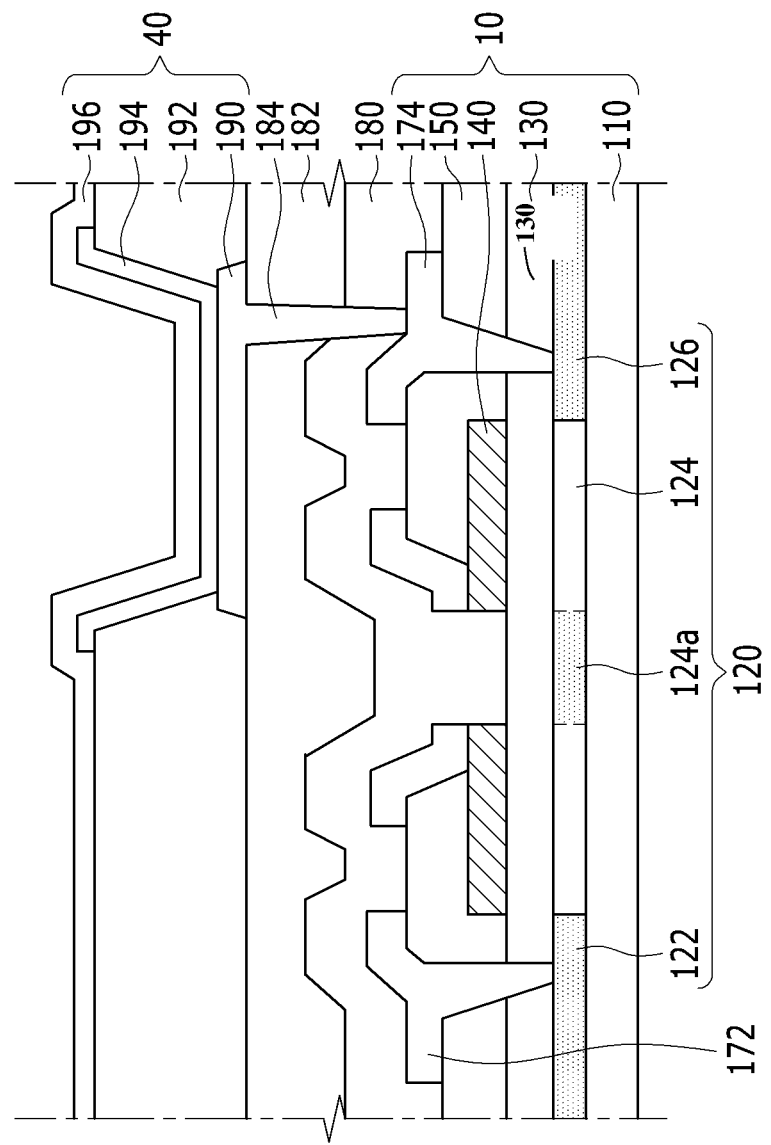

THIN FILM TRANSISTOR, FABRICATION METHOD THEREOF, AND ORGANIC LIGHT EMITTING DIODE DISPLAY HAVING THE SAME

CLAIM OF PRIORITY

This application makes reference to, incorporates the same herein, and claims all benefits accruing under 35 U.S.C. §119 from an application earlier filed in the Korean intellectual Property Office on the 18 Nov. 2011 and there duly assigned Serial No. 10-2011-0120917.

BACKGROUND OF THE INVENTION

1. Field of the Invention

The present invention relates to a thin film transistor, a fabrication method thereof, and an organic light emitting diode (OLED) display device having the same.

2. Description of the Related Art

Flat panel display devices, such as an organic light emitting diode (OLED) display, a liquid crystal display (LCD), and the like, use thin film transistors (TFTs) as switching elements and driving elements.

Due to the development of a technique for forming a TFT at a low temperature, TFTs are formed on a flexible substrate such as transparent plastic, glass, or the like. The use of flexible substrates allows flat panel display devices to be modified to have various shapes, extending their utilization range.

A driving TFT used in an OLED display device, which is an element applying driving power to a pixel electrode in order to make an organic emission layer of an organic light emitting element in a selected pixel emit light, includes a driving gate electrode, a driving source electrode, a driving drain electrode, an active layer, and the like. A gate electrode of the driving TFT is generally formed as a single gate, and according to circumstances, the gate electrode may be configured as a so-called dual-gate formed in the form of two divided gate electrodes.

When the driving TFT having a dual-gate structure is fabricated, a connection pattern should be formed to connect the two divided gate electrodes, and here, the formation of such a connection pattern causes a spatial loss. Thus, it is difficult to implement a high resolution pane.

Also, in the related art, in order to secure a driving margin, an undoped region in which impurities are not doped is formed, or a light doping region to which impurities of a low concentration are injected, is formed in a channel region of an active layer existing between the divided gate metals. To this end, however, an additional deposition process, an additional photo process, or the like is required to prevent doping through a doping mask in performing doping on source and drain regions of the active layer.

The above information disclosed in this Background section is only for enhancement of an understanding of the background of the invention, and therefore it may contain information that does not form the prior art that is already known in this country to a person of ordinary skill in the art.

SUMMARY OF THE INVENTION

The present invention has been developed in an effort to provide a thin film transistor (TFT) having the advantages of securing an excellent driving margin and including an undoped region or a low concentration region in an active layer without making a spatial loss, and an organic light emitting diode (OLED) display device having the same.

The present invention has also been developed in an effort to provide a thin film transistor (TFT) having the advantages of eliminating the necessity of an additional process in forming an undoped region or a low concentration region in an active layer.

An exemplary embodiment of the present invention provides a thin film transistor (TFT) comprising: an active layer formed, on a substrate; a gate insulating layer formed on the active layer; a gate electrode including a first gate region and a second gate region formed on portions of the gate insulating layer and spaced apart with a separation region interposed therebetween; an inter layer insulating layer formed on the gate insulating layer and the gate electrode, and having an opening formed to expose portions of the gate insulating layer and the gate electrode around the separation region; a gate connection electrode formed on the interlayer insulating layer and connected to the first gate region and the second gate region through the opening; and source and drain electrodes formed on the interlayer insulating layer.

Another embodiment of the present invention provides a method for fabricating a thin film transistor (TFT), comprising the steps of: forming an active layer, divided into source and drain regions and a channel region, on a substrate; forming a gate insulating layer on the active layer; forming a gate electrode on a portion of the gate insulating layer such that the gate electrode overlaps with the channel region; forming an interlayer insulating layer covering the gate insulating layer and the gate electrode; and forming source and drain electrodes and a gate connection electrode on the interlayer insulating layer; wherein the forming of the source and drain electrodes and the gate connection electrode includes forming a plurality of gate electrode regions by separating the gate electrode with the separation region interposed therebetween in forming the source and drain electrodes and the gate connection electrode, and wherein the respective gate electrode regions are connected by the gate connection electrode.

Yet another embodiment of the present invention provides an organic light emitting diode (OLED) display device including a thin film transistor (TFT), said TFT comprising: an active layer formed on a substrate; a gate insulating layer formed on the active layer; a gate electrode including a first gate region and a second gate region formed on portions of the gate insulating layer and spaced apart with a separation region interposed therebetween; an interlayer insulating layer formed on the gate insulating layer and the gate electrode, and having an opening formed to expose portions of the gate insulating layer and the gate electrode around the separation region; a gate connection electrode formed on the interlayer insulating layer and connected to the first gate region and the second gate region through the opening; and source and drain electrodes formed on the interlayer insulating layer; wherein a pixel, electrode is formed on the TFT, an organic emission layer is formed on the pixel electrode, and a counter electrode is formed on the organic emission layer.

According to an embodiment of the present invention, a thin film transistor (TFT) and an OLED display device having excellent driving margin, and including an undoped region or a low concentration region in an active layer without causing a spatial loss, can be fabricated.

In addition, according to an embodiment of the present invention, a TFT can be fabricated without additionally performing a process in forming the undoped region or the low concentration region, in the active layer, thus enhancing production efficiency and reducing fabrication unit cost.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein:

FIG. 6 is a cross-sectional view of an organic light emitting diode (OLED) display device including a TFT according to an embodiment of the present invention.

DETAILED DESCRIPTION OF THE INVENTION

Figure 1A:
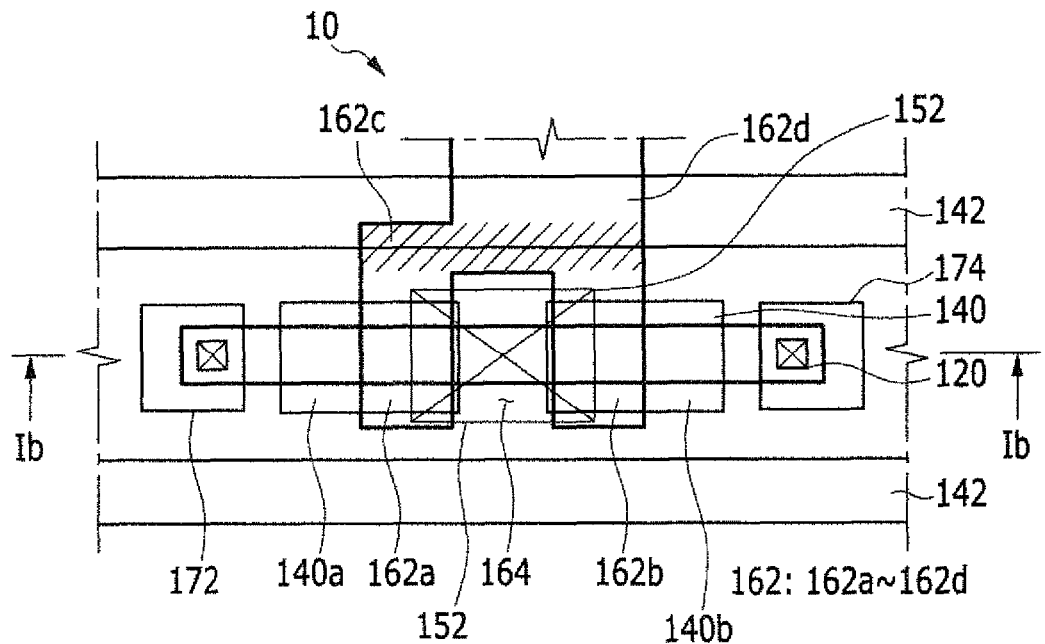
FIGS. 1A and 1B are a plan view and a cross-sectional view, respectively, of a thin film transistor (TFT) according to an embodiment of the present invention.

Hereinafter, a thin film transistor (TFT), a fabrication method thereof, and an organic light emitting diode (OLED) display device having the same will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the same reference numerals will be used throughout to designate the same or like components.

In the drawings, the thickness of several layers and regions are magnified for clarification, in the drawings, the thickness of some of layers and regions are exaggerated for the sake of explanation. It will be understood that, when an element such as a layer, film, region, or plate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements. Also, throughout the specification, "on" means that an element is positioned on or above or under or below another element and may not necessarily mean that an element is positioned at an upper side of another element based on a gravitation direction.

Figure 1B:
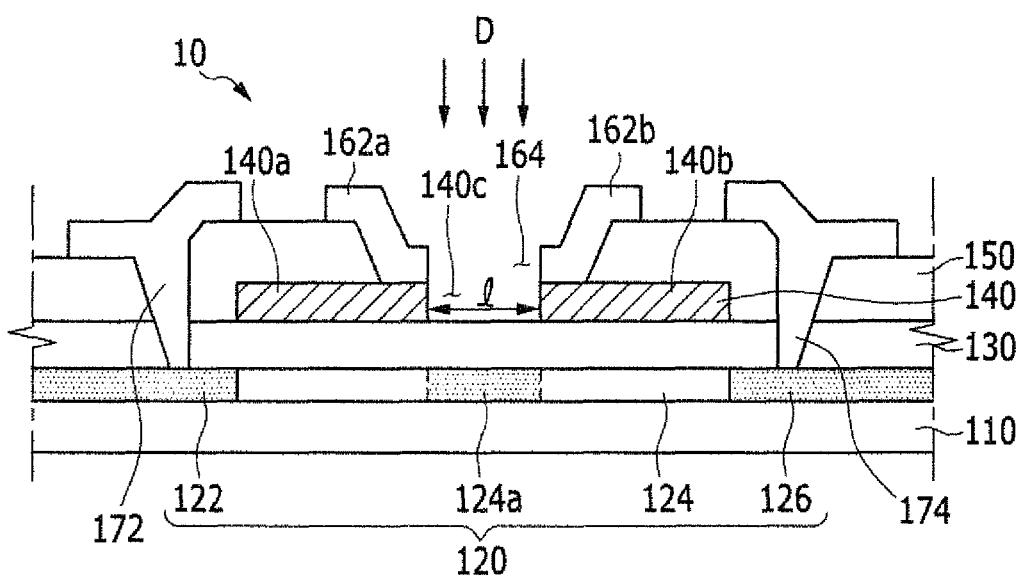

FIGS. 1A and 1B are a plan view and a cross-sectional view, respectively, of a thin film transistor (TFT) according to an embodiment of the present invention; FIGS. 2A, 3A, 4A, and 5A are plan views sequentially showing a method for fabricating a TFT according to an embodiment of the present invention; and FIGS. 2B, 3B, 4B, and 5B are cross-sectional views sequentially showing a method for fabricating a TFT according to an embodiment of the present invention. Here, FIG. 1B is a cross-sectional view taken along line Ib-Ib in FIG. 1A, and FIGS. 2B to 5B are cross-sectional views taken along lines IIb-IIb, IIIb-IIIb, IVb-IVb and Vb-Vb, respectively, in FIGS. 2A to 5A, respectively.

First, the structure of a TFT according to an embodiment of the present invention will be described in stacking order with reference to FIGS. 1A and 1B.

The TFT 10 according to an embodiment of the present invention includes an active layer 120, a gate insulating layer 130, a gate electrode 140, an interlayer insulating layer 150, gate connection electrodes 162 (162a, 162b, 162c, and 162d), and source and drain electrodes 172 and 174, respectively.

The active layer 120 is formed on a substrate 110, and here, the substrate 110 may be formed as a transparent insulating substrate. The insulating substrate includes glass, quartz, ceramic, and plastic. When the substrate 110 is made of plastic, it may be formed as a flexible substrate. However, the present invention is not limited thereto, and the substrate 110 may be formed as a metallic substrate and, in this case, the metallic substrate includes stainless steel.

A buffer layer (not shown) may be formed on the substrate 110. The buffer layer may be formed as a uni-layer of silicon nitride ($SiN_x$) or may have a dual-layer structure in which silicon nitride ($SiN_x$) and silicon oxide ($SiO_2$) are stacked. The buffer layer may serve to prevent infiltration of an unnecessary component such as impurities or moisture, and to planarize the surface. The buffer layer may be used according to the type of substrate and processing conditions, or may be omitted.

The active layer 120 is formed on the substrate 110. The active layer 120, made of a semiconductor material, is formed by patterning a semiconductor material formed on the substrate 110. The active layer 120 may be formed of a polycrystalline silicon film, or, for example, may be formed of an amorphous silicon film.

The active layer 120 may be divided into a source region 122, a channel region 124, and a drain region 126. The channel region 124 connects the source region 122 to the drain region 126. Impurities of a high concentration may be doped in the source region 122 and the drain region 126, and impurities may not be doped in the channel region 124 (undoping) or impurities of a lower concentration than that of the source region 122 and the drain region 126 may be doped in the channel region 124.

The gate insulating layer 130 is formed on the active layer 120. The gate insulating layer 130 may include one or more of various insulating materials known to a person skilled in the art, such as tetra ethyl ortho silicase (TEOS), silicon nitride ($SiN_x$), silicon oxide ($SiO_2$), and the like.

The gate electrode 140 is formed on portions of the gate insulating layer 130. The gate electrode 140 may be formed of a conductive metal film such as MoW, Al, Cr, Al/Cu, or the like, but the present invention is not particularly limited thereto, and various conductive materials including a conductive polymer may be used as a material of the gate electrode 140. The gate electrode 140 may be formed to cover a region corresponding to the channel region 124 of the active layer 120. The gate electrode 140 may be formed by forming a gate metal layer on the gate insulating layer 130 through a sputtering method, or the like, and then patterning the gate metal layer through a photolithography process and an etching process.

The gate electrode 140 includes a first gate region 140a and a second gate region 140b spaced apart with a separation region 140c therebetween, forming a dual-gate structure in which the first gate region 140a and the second gate region 140b face each other. The separation region 140c has a predetermined length l to separate the first gate region 140a and the second gate region 140b in a horizontal direction in the drawing. The method for forming the gate electrode 140 will be described in a TFT fabrication method which will be explained hereafter.

The interlayer insulating layer 150 is formed on the gate insulating layer 130 and the gate electrode 140. The interlayer insulating layer 150 may be made of an insulating material. For example, the interlayer insulating layer 150 may be made of $SiO_2$ or SiN. The interlayer insulating layer 150 includes an opening 152 formed vertically in a penetrative manner so as to expose portions of the gate electrode 140 and the gate insulating layer 130 between the first gate region 140a and the second gate region 140b spaced apart with the separation region 140c therebetween in the horizontal direction.

The source and drain electrodes 172 and 174, respectively, are formed by forming a source and drain metal layer on the interlayer insulating layer 150 through a deposition method such as sputtering, or the like, and then patterning the same through a photolithography process and an etching process. The source and drain electrodes 172 and 174, respectively, are connected to the source and drain regions 122 and 126, respectively, of the active layer 120 through holes formed in the interlayer insulating layer 150 and the gate insulating layer 130, respectively.

Gate connection electrodes 162 (162a, 162b, 162c, and 162d) are formed on the interlayer insulating layer 150 so as to connect the first gate region 140a and the second gate region 140b through the opening 152. The gate connection electrode 162 may be divided into first to fourth connection portions 162a to 162d, respectively. The first gate region 140a is connected to the first connection portion 162a extending along one side wall of the opening 152, and the second gate region 140b is connected to the second connection portion 162b extending along the other side wall of the opening 152. The first connection portion 162a and the second connection portion 162b are connected by the third connection portion 162c (shaded area in FIG. 1A), whereby the first gate region 140a and the second gate region 140b are connected. The third connection portion 162c may be connected to the fourth connection portion 162d so as to connect the gate electrode 140 to a different component, e.g., the storage element 30 (See FIG. 7).

The gate connection electrode 162 is patterned so as to be formed at the same time when the source and drain electrodes 172 and 174, respectively, are patterned, and thus the gate connection electrode 162 is made of the same material as that of the source and drain electrodes 172 and 174, respectively, and the other portions 162c and 162d, excluding the first and second connection portions 162a and 162b, respectively, formed in an extended manner at the opening 152 portion, are formed on the same plane on which the source and drain electrodes 172 and 174, respectively, are formed.

In this manner, since the first gate region 140a and the second gate region 140b spaced apart are connected by the gate connection electrode 162 formed on the same layer on which the source electrode 172 and the drain electrode 174 are formed, a spatial loss of the layer on which the gate electrode is formed can be minimized.

FIG. 6 is a cross-sectional view of an organic light emitting diode (OLED) display device including a TFT according to an embodiment of the present invention. Specifically, the cross-sectional view is taken along line VII-VII indicated in FIG. 7.

As shown in FIG. 6, the OLED display device according to an embodiment of the present invention includes a passivation film 180 and a planarization film 182 sequentially stacked on the TFT 10, a pixel electrode 190, an organic emission layer 194 formed on the pixel electrode 190, and a counter electrode 196 formed on the organic emission layer 194.

The planarization film 182 serves to eliminate a step and planarize the surface in order to enhance luminous efficiency of the organic emission layer to be formed thereon. Also, the planarization film 182 has an electrode contact hole exposing a portion of the drain electrode 174. The planarization film 182 may be made of one or more materials selected from a polyacrylates resin, an epoxy resin, a phenolic resin, a polyamides resin, a polyimides rein, an unsaturated polyesters resin, a poly phenylenethers resin, a poly phenylenesulfides resin, a benzocyclobutene (BCB), and the like. Also, the embodiment of the present invention is not limited to the foregoing structure, and any one of the passivation film 180 and the planarization film 182 may be omitted according to circumstances.

The pixel electrode 190, as an anode electrode of the OLED, is formed on the planarization film 182. The pixel electrode 190 is connected to the drain electrode 174 through the contact, hole of the planarization film 182. A pixel defining film 192 having an opening exposing the pixel electrode 190 is formed on the planarization film 182. The pixel electrode 190 is disposed so as to correspond to the opening of the pixel defining film 192, and here, the pixel electrode 190 may not necessarily be disposed only at the opening of the pixel defining film 192, and may be disposed below the pixel defining film 192 such that, a portion of the pixel electrode 190 overlaps with the pixel defining film 192. The pixel defining film 192 may be made of a resin such as a polyacrylates resin a polyimides resin, or the like, or a silica-based inorganic material or the like.

The organic emission layer 194 is formed on the pixel electrode 190, and the counter electrode 196 as a cathode electrode is formed on the organic emission layer 194. In this manner, the OLED including the pixel electrode 190, the organic emission layer 194, and the counter electrode 196 is formed.

The organic emission layer 194 is made of a low molecular organic material or a high molecular organic material. Also, the organic emission layer 194 may be formed as a multi-layer including one or more of a light emitting layer, a hole injection layer (HIL), a hole transport layer (HTL), an electron transport layer (ETL), and an electron injection layer (EIL). When the organic emission layer 194 includes all of these layers, the hole injection layer is disposed on the pixel electrode 190 as an anode (or a positive electrode), and the hole transport layer, the light emitting layer, the electron transport layer, and the electron injection layer are sequentially stacked thereon.

Also, in FIG. 6, the organic emission layer 194 is disposed only within the pixel defining film 192, but an embodiment of the present invention is not limited thereto. Thus, the organic emission layer 194 may also be disposed between the pixel defining film 192 and the counter electrode 196, and the organic emission layer 194 may as well be formed on the pixel electrode 190 within the opening of the pixel defining film 192. In detail, the organic emission layer 194 may further include various films such as the hole injection layer HIL, the hole transport layer HTL, the electron transport layer ETL, the electron injection layer EIL, and the like, along with the light emitting layer. Here, the hole injection layer HIL, the hole transport layer HTL, the electron transport layer ETL, the electron injection layer EIL, excluding the light emitting layer, may also be formed on the pixel defining film 192 as well as on the pixel electrode 190, like the counter electrode 196, by using an open mask in a fabrication process. Namely; one or more of the several films included in the organic emission layer 194 may be disposed between the pixel defining film 192 and the counter electrode 196.

The pixel electrode 190 and the counter electrode 196 may be made of a transparent conductive material or a translucent or reflective conductive material, respectively. The OLED display device may be a top emission type OLED display device, a bottom emission type OLED display device, or both-side emission type LED display device according to the types of materials forming the pixel electrode 190 and the counter electrode 196.

As the transparent conductive material, a material such as indium tin oxide (ITO), indium zinc oxide (IZO), indium oxide ($In_2O_3$), or the like may be used. As the reflective material or the translucent material, a material such as lthium (Li), calcium (Ca), fluoridated lithium/calcium (LIf/Ca), fluorinated lithium/aluminum (LiF/Al), aluminum (Al), silver (Ag), magnesium (Mg), gold (Au), or the like may be used.

A sealing member (not shown) may be disposed on the counter electrode 196 such that it opposes the display substrate 110. The sealing member may be made of a transparent material such as glass, plastic, or the like. The sealing member may be attached so as to be sealed with the display substrate 110 through a sealant formed along the edges.

Figure 7:
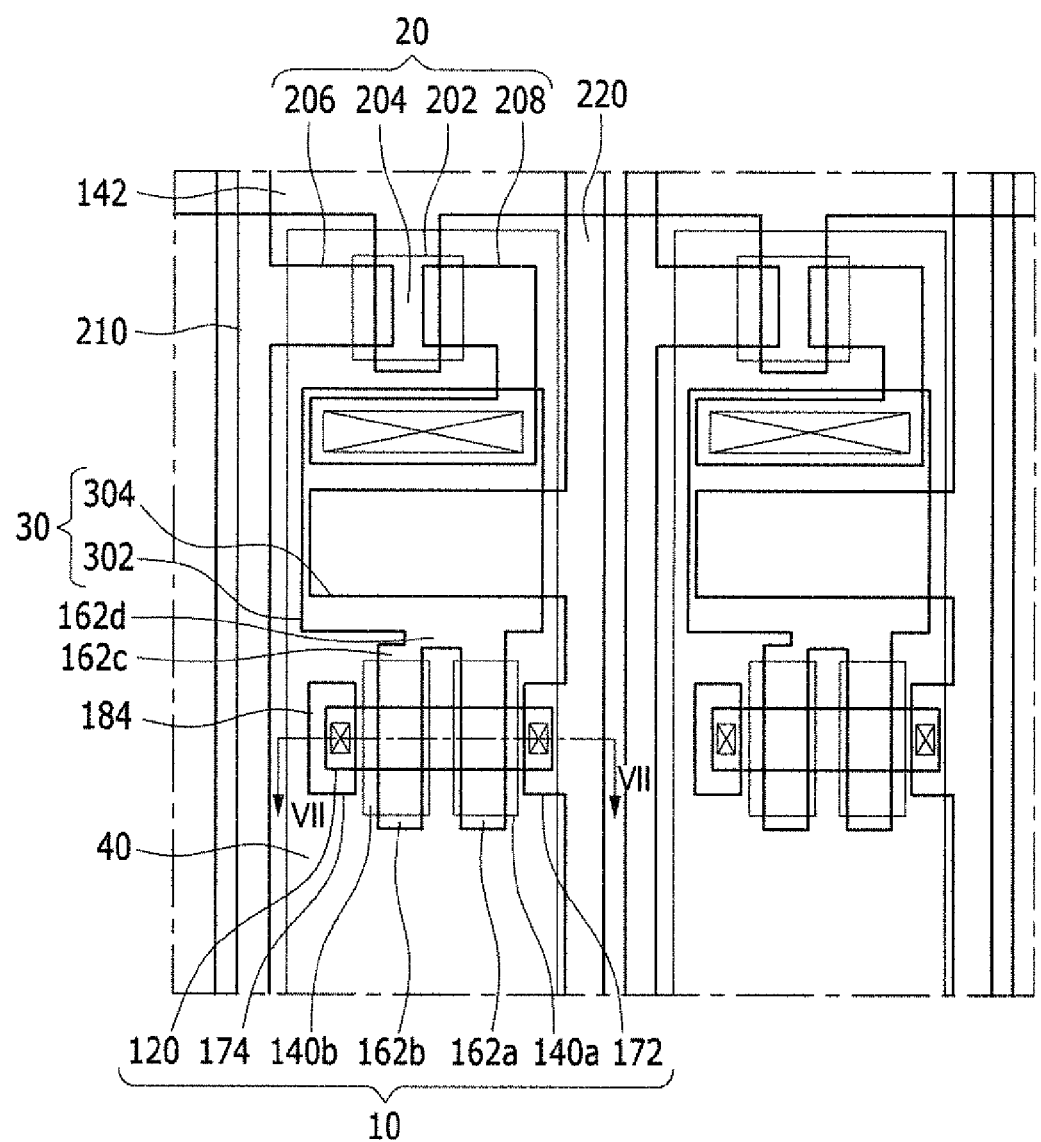
FIG. 7 is a plan view showing a portion of the OLED display device including a TFT according to an embodiment of the present invention.

FIG. 7 is a plan view showing a portion of the OLED display device including a TFT according to an embodiment of the present invention.

With reference to FIG. 7, and referring to the structure of the OLED display device, the display substrate 110 includes a switching TFT 20, a driving TFT 10, the storage element 30, and an OLED 40 including the pixel electrode 190, the organic emission layer 194 and the counter electrode 196 of FIG. 6, which are formed in each pixel. Further referring to FIG. 7, the display substrate 110 further includes a gate line 142 disposed along one direction, and a data line 210 and a common power line 220 crossing the gate line 142 in an insulative manner. Here, a pixel may be defined by the gate line 142, the data line 210, and the common power line 220 as boundaries, but is not necessarily limited thereto.

The OLED 40 includes the pixel electrode 190, the organic emission layer 194 formed on the pixel electrode 190, and the counter electrode 196 formed on the organic emission layer 194, as seen in FIG. 6. Here, the pixel electrode 190 is a positive (+) electrode (a hole injection electrode) and the counter electrode 196 is a negative (−) electrode (an electron injection electrode). However, an embodiment of the present invention is not necessarily limited thereto, and the pixel electrode 190 may be a negative electrode and the counter electrode 196 may be a positive electrode according to a driving method of the OLED display device. Holes and electrons from the pixel electrode 190 and the counter electrode 196, respectively, are injected into the organic emission layer 194. When excitons, formed as the injected holes and electrons, are combined are reduced from an excited state to a ground state, light is emitted.

The storage element 30 of FIG. 7 includes a first storage plate 302 and a second storage late 304 disposed with the interlayer insulating layer 150 of FIG. 6 interposed therebetween. Here, the interlayer insulating layer 150 is a dielectric material. Capacitance is determined, by electric charges charged in the storage element 30 of FIG. 7 and a voltage between both storage plates 302 and 304.

The switching TFT 20 includes a switching semiconductor layer 202, a switching gate electrode 204, a switching source electrode 206, and a switching drain electrode 208, and the driving TFT 10 of FIG. 6 includes the semiconductor layer 120, the gate electrode 140 having a plurality of gate electrode regions, and the source and drain electrodes 172 and 174, respectively.

The switching TFT 20 of FIG. 7 is used as a switching element for selecting pixels desired to emit light. The switching gate electrode 204 is connected to the gate line 142. The switching source electrode 206 is connected to the data line 210. The switching drain electrode 208 is disposed so as to be spaced apart from the switching source electrode 210 and connected to the first storage plate 302.

The driving TFT 10 applies driving power causing the organic emission layer 194 of the OLED 40 of FIG. 6 within the selected pixels to emit light to the pixel electrode 190. The gate electrode 140 is connected to the first storage plate 302 of FIG. 7 through the fourth connection portion 162d of the gate connection electrode 162. The source electrode 172 and the second storage plate 304 are connected to the common power line 220, respectively. The drain electrode 174 is connected to the pixel electrode 190 of the OLED 40 of FIG. 6 through an electrode contact hole 184.

With such a structure, the switching TFT 20 of FIG. 7, operated by a gate voltage applied to the gate line 142, serves to transfer a data voltage applied to the data line 210 to the driving TFT 10. A voltage corresponding to a difference between a common voltage applied to the driving TFT 10 from the common power line 220 and the data voltage transferred from the switching TFT 20 is stored in the storage element 30, and a current corresponding to the voltage stored in the storage element 30 flows to the OLED 40 through the driving TFT 10, thus causing the OLED 40 to emit light.

A method for fabricating a TFT according to an embodiment of the present invention will be described with reference to FIGS. 1A through 5B.

Figure 2A:
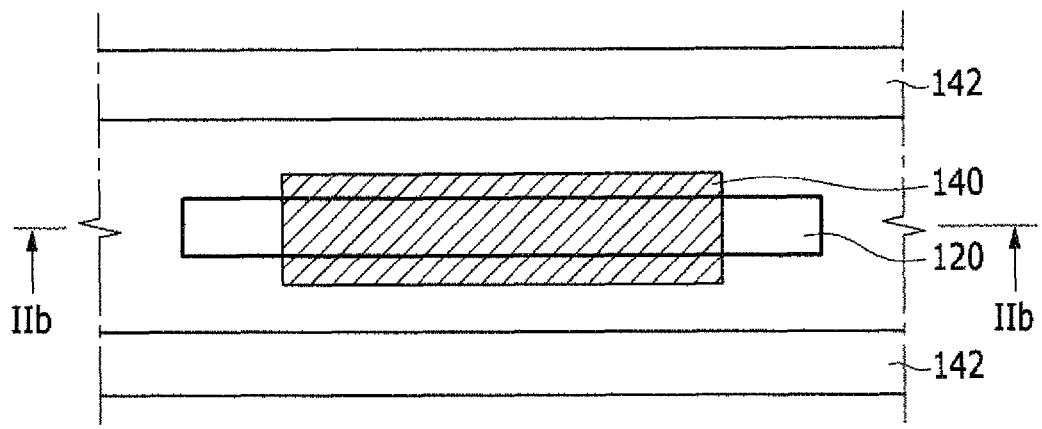
FIGS. 2A, 3A, 4A, and 5A are plan views sequentially showing a method for fabricating a TFT according to an embodiment of the present invention.
Figure 2B:
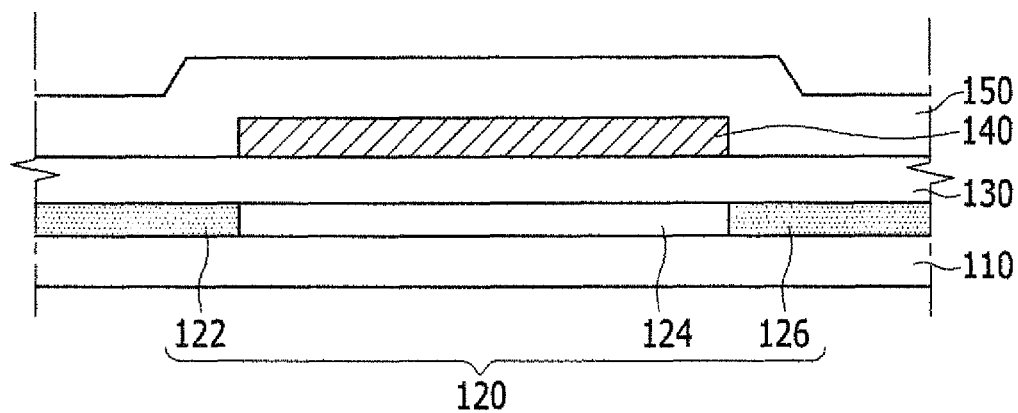
FIGS. 2B, 3B, 4B, and 5B are cross-sectional views sequentially showing a method for fabricating a TFT according to an embodiment of the present invention.

First, as shown in FIGS. 2A and 2B, the active layer 120 is formed on the substrate 110. The active layer 120 is formed by patterning a semiconductor material formed on the substrate 110. Namely, a semiconductor material may be deposited on the substrate 110 and the deposited semiconductor material is formed into a certain pattern through a photolithography process and an etching process.

Next, the gate insulating layer 130 is formed on the active layer 120. The gate insulating layer 130 may be formed by depositing an insulating material, including a silicon nitride ($SiN_x$) and a silicon oxide, on the active layer 120.

Then, the gate electrode 140 is formed on a portion of the gate insulating layer 130. The gate electrode 140 may be formed by forming a gate metal layer on the gate insulating layer 130 through a deposition method, e.g., sputtering, and then, patterning the same through a photolithography process and an etching process. The gate electrode 140 may be patterned so as to be formed to overlap with the channel region 124 of the active layer 120.

Thereafter, the interlayer insulating layer 150 is formed to cover the gate insulating layer 130 and the gate electrode 140. The interlayer insulating layer 150 may be formed by depositing an insulating material such as $SiO_2$, SiN, or the like.

Figure 4A:
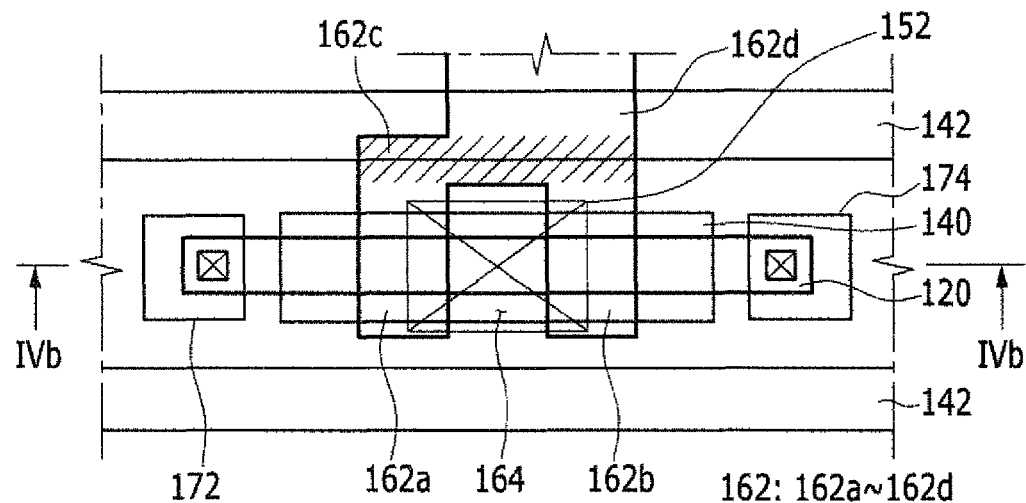
Figure 4B:
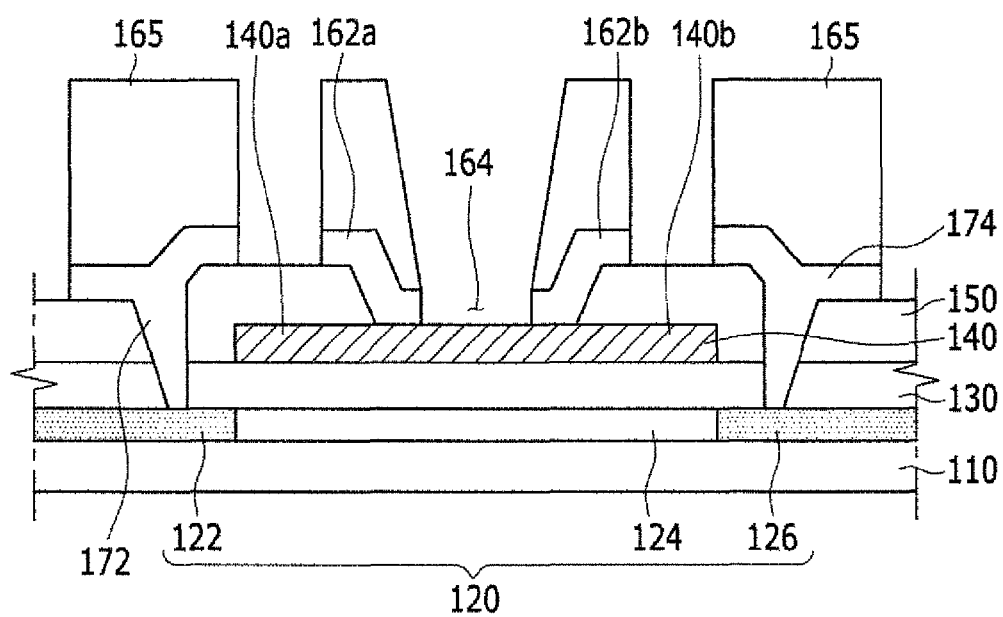

Then, as shown in FIGS. 4A and 4B, the source and drain electrodes 172 and 174, respectively, and the gate connection electrode 162 are formed on the interlayer insulating layer 150. The source and drain electrodes 172 and 174, respectively, and the gate connection electrode 162 are formed together through the same process. Since a method for forming the source and drain electrodes 172 and 174, respectively, is the same as that of the known technique in the art, a method for forming the gate connection electrode 162 will be largely described.

In forming the source and drain electrodes 172 and 174, respectively, and the gate connection electrode 162, the gate electrode 140 is separated (or divided) with the separation region 140c (see FIG. 5B) interposed therebetween to form a plurality of gate electrode regions. The gate electrode 140 is formed so as to be separated into the first gate electrode 140a and the second gate electrode 140b, and the separated first gate electrode 140a and the second gate electrode 140b are connected by the gate connection, electrode 162 (see FIG. 5B).

Figure 3A:
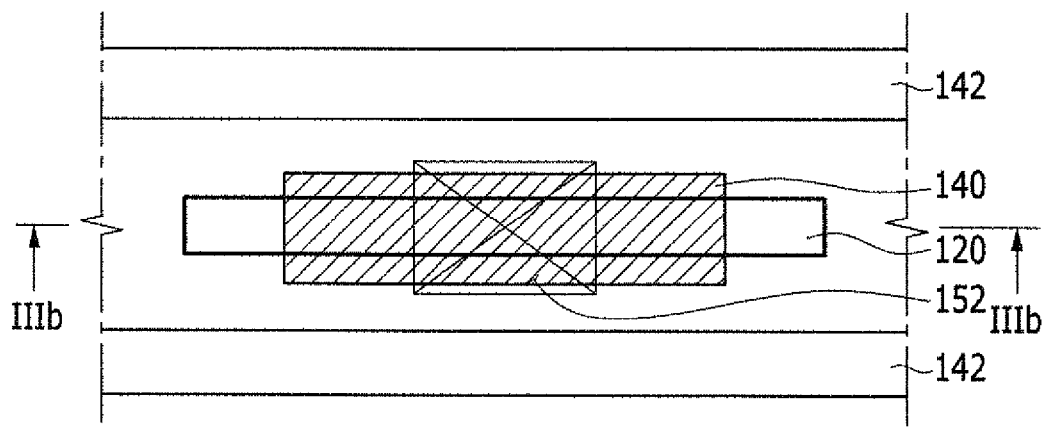
Figure 3B:
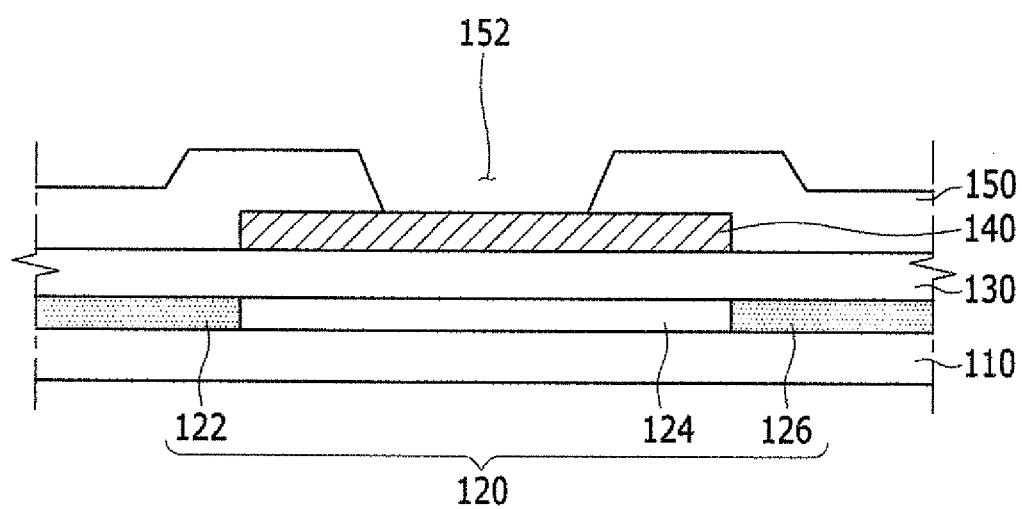

As for the gate connection electrode 162, first, as shown in FIGS. 3A and 3B, the interlayer insulating layer 150 is patterned to form the opening 152 vertically in a penetrative manner having a certain area. The opening 152 may be formed in the interlayer insulating layer 150 through a photolithography process and an etching process. A portion of the gate electrode 140, e.g., a central portion of the gate electrode 140 as shown in FIGS. 3A and 3B, is exposed through the opening 152.

After the opening 152 is formed, the source and drain metal layer (not shown) is deposited to form the source and drain electrodes 172 and 174, respectively, and the gate connection electrode 162. Here, as the depositing method, various known depositing methods (e.g., sputtering or the like) may be performed. The source and drain metal layer is formed on the interlayer insulating layer 150, on the gate electrode 140 exposed by the opening 152, and on the side wall of the opening 152.

As shown in FIGS. 4A and 4B, the source and drain metal layer is patterned to form the pattern of the source and drain electrodes 172 and 174, respectively, and the pattern of the gate connection electrode 162. The pattern of the source and drain electrodes 172 and 174, respectively, and the pattern of the gate connection electrode 162 pattern are formed through the same process. The source and drain electrodes 172 and 174, respectively, and the gate connection electrode 162 may be patterned to have a certain pattern through a photolithography process and an etching process. The shape and the pattern of the gate connection electrode 162 is the same as described above.

When the pattern of the source and drain electrodes 172 and 174, respectively, and the pattern of the gate connection electrode 162 are formed, the pattern of the gate connection electrode 162 may be formed such that a portion of the gate electrode 140 is exposed, and then, the exposed gate electrode 140 may be patterned to form the plurality of gate electrode regions 140a and 140b. Here, preferably, an exposed region 164 (FIG. 4B) of the source and drain metal layer formed through etching is smaller than the region of the opening 152 (FIG. 4A) to allow the source and drain metal layer to be connected to the exposed gate electrode 140.

Figure 5A:
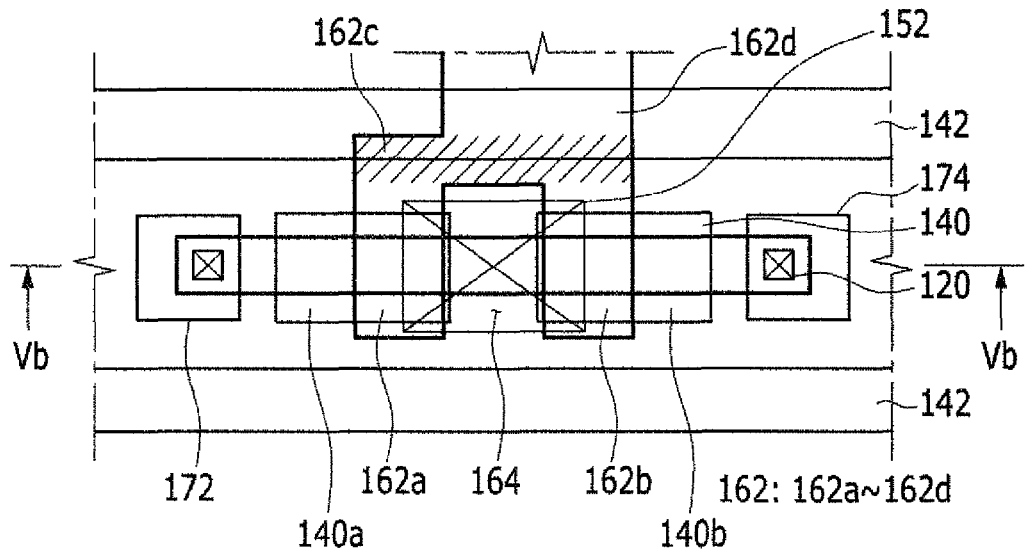
Figure 5B:
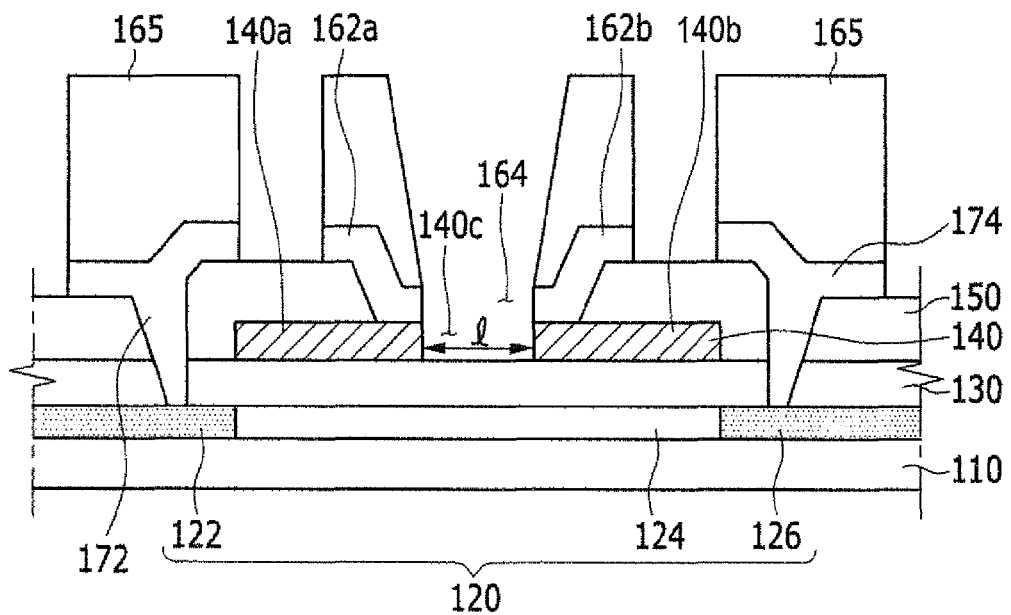

In addition, as shown in FIG. 5B, with a mask pattern 165 formed on the source and drain metal layer remaining as it is, the exposed gate electrode 140 is etched to separate the gate electrode 140 into gate electrode regions with the separation region 140c interposed therebetween. Namely, the gate electrode 140 is separated through the etching process to form the first gate electrode 140a and the second gate electrode 140b. Although the gate electrode 140 is separated into the first gate electrode 140a and the second gate electrode 140b, the first gate electrode 140a and the second gate electrode 140b are connected by the gate connection electrode 162. Since the mask pattern 165 for forming the source and drain electrodes 172 and 174, respectively, is used as it is, the plurality of gate electrode regions can be formed together in the stage when the source and drain electrodes 172 and 174, respectively, and the gate connection electrode 162 are formed without performing any additional process to separate the gate electrode 140.

Conductive impurities may be doped in the source and drain regions 122 and 126, respectively, of the active layer 120 (FIG. 5B), and preferably the doping is performed before the plurality of gate electrode regions are formed. When the conductive impurities are doped before the plurality of gate electrode regions are formed, the conductive impurities cannot pass through the gate electrode 140, preventing the impurities from being doped in the channel region 124. Namely, when the conductive impurities are doped before the plurality of gate electrode regions are formed, the conductive impurities can be prevented from being doped in the active layer 120 between the separated gate electrode regions. The conductive impurities are ion-implanted through the gate insulating layer 130 on which the gate electrode 140 is formed. Here, preferably, ion implantation energy has such strength as to allow the conductive impurities to pass through the gate insulating layer 130 but not through both the gate electrode 140 and the gate insulating layer 130 simultaneously. The conductive impurities may be, for example, N+ type impurities. The conductive impurities form a high concentration impurity region in the region of the active layer which does not overlap with the gate electrode 140, namely, in the source and drain regions 122 and 126, respectively. The conductive impurities are not injected into the region which overlaps with the gate electrode, namely, into the channel, region 124.

After the gate electrode 140 is divided in the horizontal direction into the gate electrode regions 140a and 140b which are spaced apart, as shown in FIG. 1B, conductive impurities D may be doped in the active layer 120 through the separation region 140a between the gate electrodes 140. Here, the conductive impurities D are doped in the region 124a of FIG. 6, which does not overlap with the gate electrode 140, of the channel region 124 of the active layer 120, and the concentration of the conductive impurities doped in the channel region may be lower than that of the conductive impurities of the source and drain regions 122 and 126, respectively.

Hereinafter, the effect of the TFT fabricated according to an embodiment of the present invention will be described.

Figure 8:
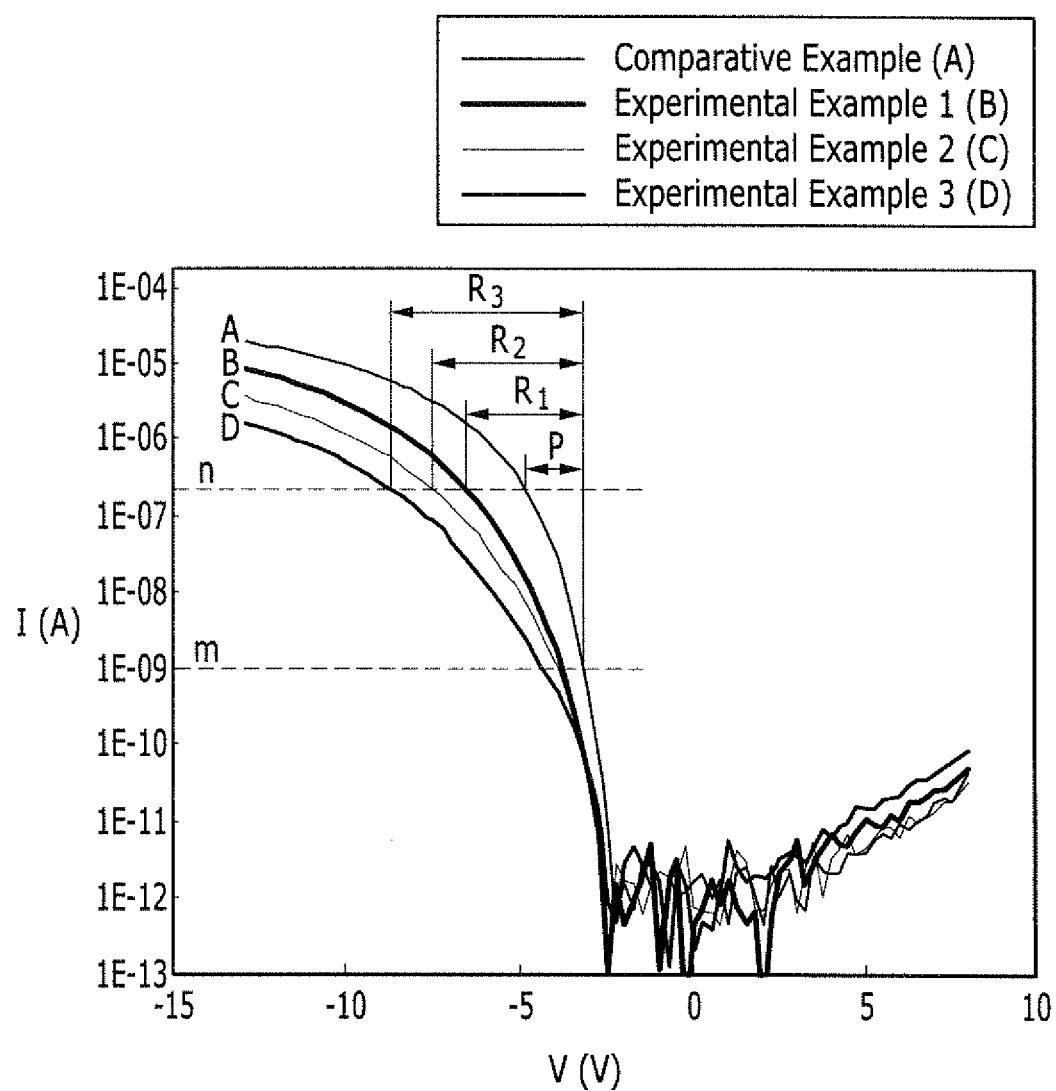
FIG. 8 is a graph showing driving voltage-driving current characteristics of the TFT according to an embodiment of the present invention.

FIG. 8 is a graph showing driving voltage-driving current, characteristics of the TFT according to an embodiment of the present invention.

Driving margins of a TFT including a single gate rather than a dual gate (Comparative Example) and driving margins of a TFT according to an embodiment of the present invention (Experimental Examples 1 to 3) are compared. In the Experimental Example 1, a distance l between the first gate electrode 140a and the second gate electrode 140b was formed to be 3 μm, that of Experimental Example 2 was formed to be 4 μm, and that of Experimental Example 3 was formed to be 5 μm.

In FIG. 8, when a difference between a driving voltage at a driving current 1 nA (dotted line m) and a driving voltage at a driving current 500 nA (dotted line n) is defined as a driving margin. Comparative Example has a driving margin of about 1.7V, Experimental Example 1 has a driving margin of about 3.58V, Experimental Example 2 has a driving margin of about 4.68V, and Experimental Example 3 has a driving margin of about 5.70V. This can be summed up as shown in Table 1 below.

TABLE 1

|  | Comparative Example | Experimental Example 1 | Experimental Example 2 | Experimental Example 3 |
| --- | --- | --- | --- | --- |
| Length of l (μm) | — | 3 | 4 | 5 |
| Driving margin (V) | 1.7 | 3.58 | 4.68 | 5.70 |

<Driving Margin According to the Length of l in Comparative Example and Experimental Examples>

Regardless of whether the TFT including a single gate electrode or the TFT including a dual-gate electrode is used, it is difficult to obtain a high driving margin. As noted in Table 1, the driving margin is reduced as the distance l is shortened, and when the distance l is determined to be 3 μm or shorter for high resolution, Comparative Example has a driving margin of 1.6 V to 2.0 V. In comparison, in the case of the TFT according to an embodiment of the present invention, although the distance l is determined to be 3 μm or shorter, the driving margin of 3V or greater can be obtained.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor (TFT), comprising:
   an active layer formed on a substrate;
   a gate insulating layer formed on the active layer;
   a gate electrode including a first gate region and a second gate region formed on portions of the gate insulating layer, the first gate region and the second gate region being spaced apart with a separation region interposed therebetween;
   an interlayer insulating layer formed on the gate insulating layer and the gate electrode and having an opening formed to expose portions of the gate insulating layer and the gate electrode around the separation region;
   a gate connection electrode formed on the interlayer insulating layer and connected to the first gate region and the second gate region through the opening; and
   source and drain electrodes formed on the interlayer insulating layer.

2. The thin film transistor of claim 1, wherein the gate connection electrode is formed on a surface on which the source and drain electrodes are formed.

3. The thin film transistor of claim 1, wherein the gate connection electrode comprises:
   a first connection portion extending along one side wall of the opening so as to be connected to the first gate region;
   a second connection portion extending along another side wall of the opening so as to be connected to the second gate region; and
   a third connection portion formed on the interlayer insulating layer and connecting the first and second connection portions.

4. The thin film transistor of claim 1, wherein the active layer is divided into source and drain regions doped with conductive impurities and a channel region, and the channel region is one of not doped and doped with impurities of a lower concentration than that of the source and drain regions.

5. An organic light emitting diode (OLED) display device, comprising a thin film transistor (TFT) including:
   an active layer formed on a substrate
   a gate insulating layer formed on the active layer;
   a gate electrode including a first gate region and a second gate region formed on portions of the gate insulating layer, the first gate region and the second gate region being spaced apart with a separation region interposed therebetween;
   an interlayer insulating layer formed on the gate insulating layer and the gate electrode and having an opening formed to expose portions of the gate insulating layer and the gate electrode around the separation region;
   a gate connection electrode formed on the interlayer insulating layer and connected to the first gate region and the second gate region through the opening; and
   source and drain electrodes formed on the interlayer insulating layer; and
   wherein said OLED display device further comprises a pixel electrode formed on the TFT, an organic emission layer formed on the pixel electrode, and a counter electrode formed on the organic emission layer.

6. The OLED display device of claim 5, wherein the gate connection electrode is formed on a surface on which the source and drain electrodes are formed.

7. The OLED display device of claim 5, wherein the gate connection electrode comprises:
   a first connection portion extending along one side wall of the opening so as to be connected to the first gate region;
   a second connection portion extending along another side wall of the opening so as to be connected to the second gate region; and
   a third connection portion formed on the interlayer insulating layer and connecting the first and second connection portions.

8. The OLED display device of claim 5, wherein the active layer is divided into source and drain regions doped with conductive impurities and a channel region, and wherein the channel region is one of not doped and doped with impurities of a lower concentration than a concentration of the source and drain regions.

* * * * *